United States Patent
Li et al.

(10) Patent No.: US 8,717,214 B1
(45) Date of Patent: May 6, 2014

(54) PRECISION SUB-RADIX$_2$ DAC WITH LINEARITY CALIBRATION

(71) Applicant: Maxim Integrated Products, Inc., San Jose, CA (US)

(72) Inventors: Yuanfang Li, Irvine, CA (US); David Castaneda, Morgan Hill, CA (US); Daniel Alexander, Chandler, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/669,958

(22) Filed: Nov. 6, 2012

Related U.S. Application Data (63) Continuation-in-part of application No. 13/023,093, filed on Feb. 8, 2011, now Pat. No. 8,330,634.

(51) Int. Cl.
*H03M 1/66* (2006.01)

(52) U.S. Cl.
USPC .......................... 341/145; 341/144; 341/154

(58) Field of Classification Search
USPC ........................... 341/144–145, 154
See application file for complete search history.

(56) References Cited

U.S. PATENT DOCUMENTS

| | | | |
|---|---|---|---|
| 4,336,526 A | 6/1982 | Weir | |
| 4,396,907 A | 8/1983 | Wintzer et al. | |
| 4,843,394 A | 6/1989 | Linz et al. | |
| 4,970,514 A | 11/1990 | Draxelmayr | |
| 5,977,898 A | 11/1999 | Ling et al. | |
| 6,154,121 A | 11/2000 | Cairns et al. | |
| 6,380,877 B2 | 4/2002 | Castaneda et al. | |
| 6,781,536 B1 * | 8/2004 | Martins | 341/144 |
| 7,242,338 B2 * | 7/2007 | Jiang et al. | 341/154 |
| 7,535,389 B1 | 5/2009 | Teterwak | |
| 8,330,634 B2 | 12/2012 | Li et al. | |

OTHER PUBLICATIONS

Ziya G. Boyacigiller, Basil Weir and Peter D. Bradshaw, Session VI: Acquisition Circuits; "An Error-Correcting 14b/20 μs CMOS A/D Converter", Feb. 18, 1981, IEEE International Solid-State Circuits Conference; pp. 62-63.

* cited by examiner

*Primary Examiner* — Khai M Nguyen

(57) ABSTRACT

An N bit sub-binary radix digital-to analog converter (DAC) includes a radix conversion module that converts an m bit digital input signal to an N bit sub-radix DAC code. A ladder module having NL bits has a plurality of first circuit elements corresponding to first respective bits of the N bit sub-radix DAC code. A segment module having NS bits has at least one second circuit element corresponding to second respective bits of the N bit sub-radix DAC code. N>m, and N is the sum of NL and NS.

20 Claims, 9 Drawing Sheets

$WL_0=1$
for i=1 to NL
  $WL_i=1$
  Vout=0
  for j=i-1 down to 0
    if out+$b_j$<$b_i$ then
      Vout=out+$b_j$
      $WL_i$=$WL_i$+$WL_j$
    end if
  end for
end for

FIG. 8 for seg=0 to $2^{NS}$-2
  $WS_{seg}=1$
  Vout=0
  if seg>0
    $WS_{seg}=WS_{seg}+WS_{seg-1}$
    Vout=out+seg_sum$_{seg-1}$
  end if
  for j=NL-1 down to 0
    if (out+$b_j$)<seg_sum$_{seg}$
      Vout=Vout+$b_j$
      $WS_{seg}=WS_{seg}+WL_j$
    end if
  end for
end for

| good code ratio=1.5 | | |
|---|---|---|
| Input DAC Code | Radix DAC Code | OUT |
| 000 | 0000 | 0 |
| 001 | 0001 | 1 |
| 010 | 0100 | 2.25 |
| 011 | 0101 | 3.25 |
| 100 | 1001 | 4.375 |
| 101 | 1010 | 4.875 |
| 110 | 1101 | 6.625 |
| 111 | 1110 | 7.125 |

PRECISION SUB-RADIX$_2$ DAC WITH LINEARITY CALIBRATION

CROSS-REFERENCE TO RELATED APPLICATIONS

This application is a continuation-in-part of U.S. patent application Ser. No. 13/023,093, filed on Feb. 8, 2011. The entire disclosure of the above application is incorporated herein by reference.

FIELD

The present disclosure relates to a sub-binary radix digital-to-analog converter (DAC).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) receive a digital input signal and convert the digital input signal into an analog output signal. The digital input signal has a range of digital codes that are converted into a continuous range of analog signal levels of the analog output signal. Accordingly, DACs are typically used to convert data between applications operating in digital and analog domains. For example only, applications of DACs include, but are not limited to, video display drivers, audio systems, digital signal processing, function generators, digital attenuators, data storage and transmission, precision instruments, and data acquisition systems.

A variety of types of DACs are available based upon desired functionality. For example only, DACs may have varying predetermined resolutions of the digital input signal, receive different encoded digital input signals, have different ranges of analog output signals using a fixed reference or a multiplied reference, and provide different types of analog output signals. Various DAC performance factors include, but are not limited to, settling time, full scale transition time, accuracy or linearity, and resolution.

A number of bits (i.e. a bit width) of the digital input signal defines the resolution, a number of output (quantization) levels, and a total number of digital codes that are acceptable for the DAC. For example, if the digital input signal is m-bits wide, the DAC has $2^m$ output levels.

In sub-binary radix (i.e. sub-radix$_2$) DACs, the ratio of a weighted DAC element to a next (lower) weighted DAC element is a constant less than 2 (i.e. sub-binary). For example only, the ratio may be approximately 1.85.

Figure 1:
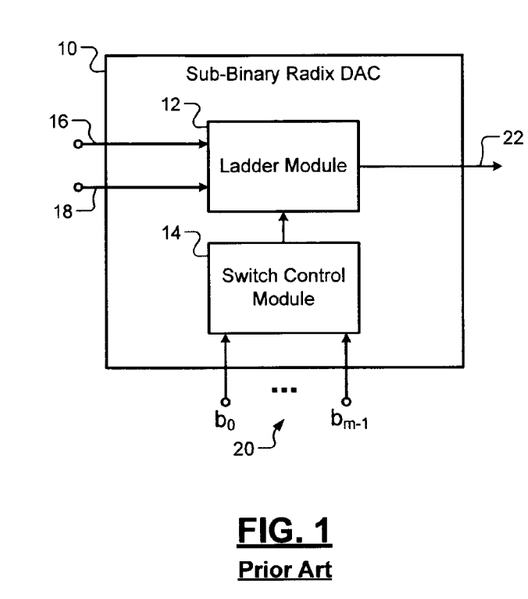
FIG. 1 is a functional block diagram of a sub-binary radix DAC according to the prior art.

Referring now to FIG. 1, an example sub-binary radix DAC 10 includes a ladder module 12 having m ladder bits and a switch control module 14. For example only, the ladder module 12 is an R-βR ladder. The ladder module 12 receives analog reference signals 16 and 18. For example only, the analog reference signal 16 may be ground and the analog reference signal 18 may be a positive reference voltage. The switch control module 14 receives bits $b_0, b_1, \ldots, b_{m-1}$ of an m-bit binary digital input signal 20 and controls switches (not shown) of the ladder module 12 based on the m bits of the digital input signal 20. The ladder module 12 generates an analog output signal 22 based on the digital input signal 20 (i.e. the controlled switches of the ladder module 12) and the analog reference signals 16 and 18. Accordingly, the analog output signal 22 corresponds to the digital-to-analog conversion of the digital input signal 20.

Figure 2:
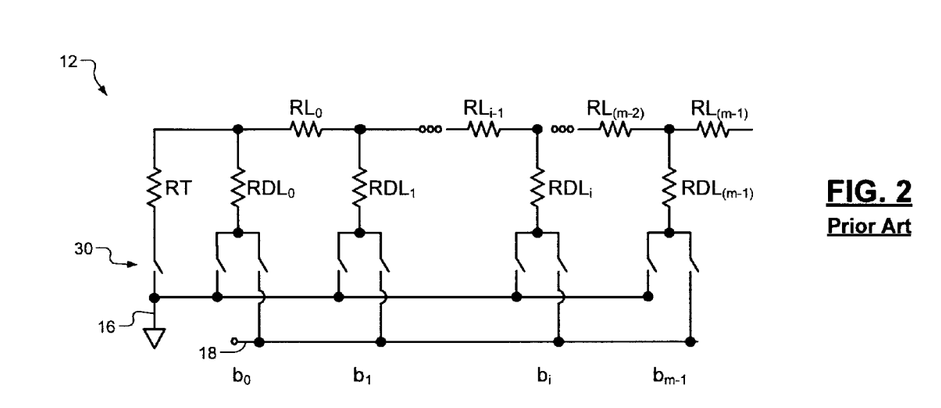
FIG. 2 is a schematic of a ladder module of a sub-binary radix DAC according to the prior art.

Referring now to FIG. 2, the ladder module 12 of the DAC 10 is shown to include resistors $RL_0 \ldots RL_{m-1}$, referred to collectively as $RL_i$, and resistors $RDL_0 \ldots RDL_{m-1}$, referred to collectively as resistors $RDL_i$. Each of the resistors $R_i$ has a value R and each of the resistors $RDL_i$ has a value βR. In other words, β corresponds to a ratio of an RDL resistor value to an RL resistor value. A termination resistor RT has a value of γR. The values of β and γ satisfy the equation $\gamma 2 = \beta + \gamma$. The radix of the DAC 10 corresponds to $$\frac{\gamma}{\gamma - 1}.$$

The analog reference signals 16 and 18 are selectively provided to the resistors RT and $Ra_i$ via switches 30.

The sub-binary radix DAC 10 is not monotonic. In other words, a transfer function of the DAC 10 is non-monotonic and a conversion between the non-monotonic transfer function and a monotonic transfer function is needed. Further, due to code overlapping, a dynamic range of the DAC 10 is reduced. Consequently, the DAC 10 uses additional bits to recover the dynamic range, and an algorithm is used to convert the bits of the m-bit binary digital input signal 20 to a sub-radix DAC code having additional bits. Conversion between the non-monotonic transfer function and the monotonic transfer function is performed via a calibration step and a radix conversion step.

Figure 3:
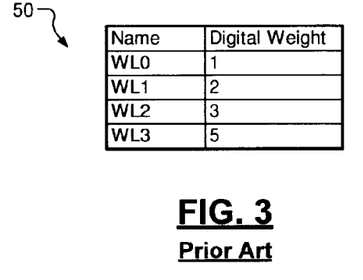
FIG. 3 is a calibration table for a sub-binary radix DAC according to the prior art.

The calibration step is performed using an example recursive successive approximation method. The method determines a last code having a smaller value than an analog bit weight of a current bit for each of the bits of the digital input signal 20 (from the LSB to the MSB). Results of the method are used to generate a calibration table that associates each bit i from 0 to m−1 with a corresponding digital weight $WL_i$. An example calibration table 50 for m=4 is shown in FIG. 3. The example calibration table 50 corresponds to the following design parameters: effective number of bits (i.e. bits of input DAC code)=3; radix DAC number of bits=4; and radix=1.5.

Figure 4:
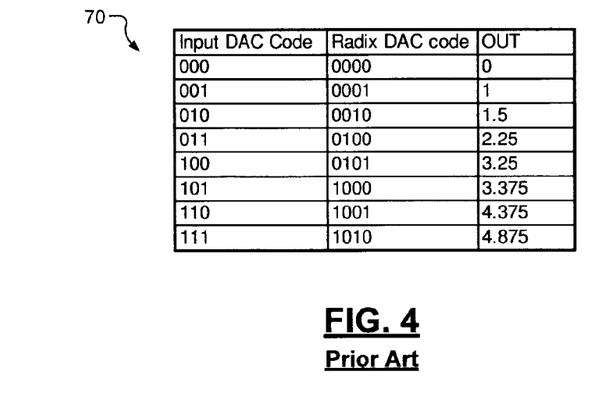
FIG. 4 is a code mapping table of a sub-binary radix DAC according to the prior art.

The radix conversion step is performed using an example successive subtraction method. The method performs successive subtraction of the digital weight $WL_i$ from the binary input value of the digital input signal 20 to determine which bits of the DAC 10 are set and which bits of the DAC 10 are cleared. Results of the method are used to generate a radix DAC code, and subsequently an output value, for each input DAC code. For example only, a code mapping table 70 as shown in FIG. 4 illustrates a relationship between input DAC codes from 000 to 111 and corresponding radix DAC codes and output values. The example code mapping table 70 corresponds to the following design parameters: effective number of bits=3; radix DAC number of bits=4; and radix=1.5.

SUMMARY

An N bit sub-binary radix digital-to analog converter (DAC) includes a radix conversion module that converts an m bit digital input signal to an N bit sub-radix DAC code. A ladder module having NL bits has a plurality of first circuit elements corresponding to first respective bits of the N bit sub-radix DAC code. A segment module having NS bits has at least one second circuit element corresponding to second respective bits of the N bit sub-radix DAC code. N>m, and N is the sum of NL and NS.

A method for operating an N bit sub-binary radix digital-to analog converter (DAC) includes converting an m bit digital input signal to an N bit sub-radix DAC code, receiving, at a ladder module having NL bits and a plurality of first circuit elements, first input signals corresponding to first respective bits of the N bit sub-radix DAC code, and receiving, at a segment module having NS bits and at least one second circuit element, second input signals corresponding to second respective bits of the N bit sub-radix DAC code, wherein N>m, and N is a sum of NL and NS.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 5:
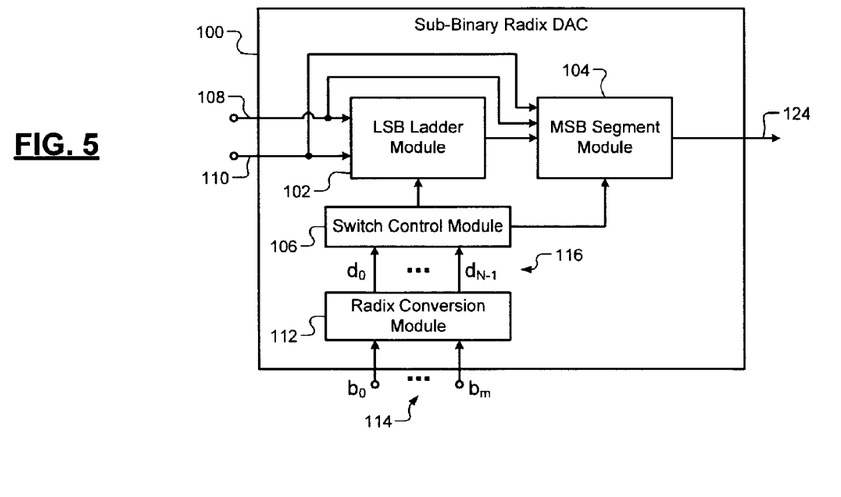
FIG. 5 is a functional block diagram of a sub-binary radix DAC according to the present disclosure.

Referring now to FIG. 5, a sub-binary radix DAC 100 according to the present disclosure includes an LSB ladder module 102, an MSB segment module 104, and a switch control module 106. For example only, the LSB ladder module 102 is an R-βR ladder. The LSB ladder module 102 and the MSB segment module 104 receive analog reference signals 108 and 110. For example only, the analog reference signal 108 may be ground and the analog reference signal 110 may be a positive reference voltage.

A radix conversion module 112 receives a binary digital input signal 114 and outputs an N bit switch control signal 116, where N (a number of radix DAC bits) corresponds to NL (a number of ladder bits)+NS (a number of segment bits). In other words, N=NL+NS. For example only, for an 18 bit DAC (i.e. for an 18 bit digital input signal), N is greater than 18. The value of NS (and therefore N) may be selected based on desired linearity or other performance parameters. N, NL, and NS may be integers.

The switch control module 106 receives the N bits of the switch control signal 116 and controls switches (not shown) of the LSB ladder module 102 and the MSB segment module 104 based on the switch control signal 116. For example only, MSB segments of the MSB segment module 104 may be thermometer encoded. The MSB segment module 104 provides NS segment bits and generates an analog output signal 124 based on the controlled switches of the LSB ladder module 102 and the MSB segment module 104 and the analog reference signals 108 and 110. Accordingly, the analog output signal 124 corresponds to the digital-to-analog conversion of the digital input signal 114 after the radix conversion module 112 converts the digital input signal 114 to the N bit switch control signal 116.

Figure 6:
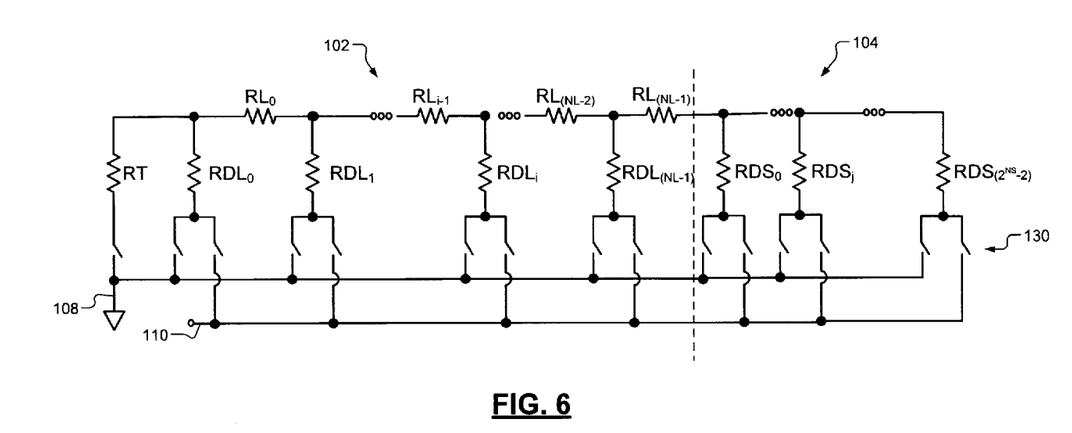
FIG. 6 is a schematic of a combination of a ladder module and an MSB segment module of a sub-binary radix DAC according to the present disclosure.

Referring now to FIG. 6, the LSB ladder module 102 of the DAC 100 is shown to include resistors RL0 . . . RLNL−1, referred to collectively as RLi, resistors RDL0 . . . RDLNL−1, referred to collectively as resistors RDLi, and termination resistor RT. Each of the resistors RLi has a value R and each of the resistors RDLi has a value βR. The termination resistor RT has a value of γR. The values of β and γ satisfy the equation γ2=β+γ. The MSB segment module 104 is shown to include resistors RDS0 . . . RDS(2NS−2), referred to collectively as resistors RDSj. Each of the resistors RDSj has a value βR. The analog reference signals 108 and 110 are selectively provided to the resistors RT, RDLi, and RDSj via switches 130. The modified structure of the DAC 100 including the bits provided by the MSB segment module 104 improves resistance and drift sensitivities of the switch and metal connections of the DAC 100. Further, the MSB segment module 104 improves output noise of the DAC 100 without lowering DAC unit resistance.

Bits of the ladder module 102 and the segment module 104 are set or cleared using the switches 130. For example, a bit may be set when a corresponding one of the switches 130 connected to the analog reference signal 110 is closed. Conversely, a bit may be cleared when a corresponding one of the switches 130 connected to ground is closed.

Although the DAC 100 as described above implements a fixed radix for each bit, any of the techniques described herein may be applied to a mixed radix. For example only, a first number of bits associated with the LSB ladder module 102 may have a first radix (e.g. 2). Accordingly, a first number of stages of the LSB ladder module 102 associated with the first number of bits may operate as an R-2R DAC. For example only, the first number of bits may correspond to a number of stages that ensures monotonic output without any calibration. A remaining number of bits associated with the LSB ladder module 102 may have a different radix. The number of bits having the different radix may be determined based on, for example only, resistor matching and desired monotonic output.

An algorithm according to the present disclosure performs conversion between a non-monotonic transfer function of the DAC 100 and a monotonic transfer function via a calibration step and a radix conversion step. The calibration step includes an LSB ladder calibration step, an MSB segment calibration step, and a calculation of a good code ratio (e.g. a ratio based on a total number of monotonic codes). The radix conversion step converts the incoming digital code to a sub-radix DAC setting.

Figure 7:
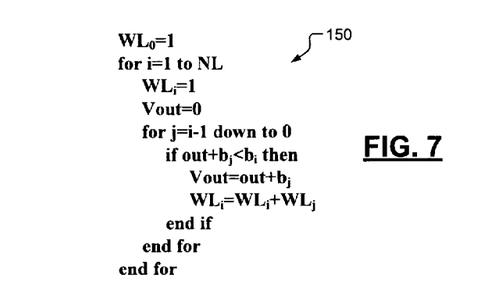
FIG. 7 illustrates a ladder calibration method using recursive successive approximation according to the present disclosure.

Referring now to FIG. 7, the LSB ladder calibration step is performed using, for example only, a recursive successive approximation method 150. The method 150 determines a last code having a smaller value than an analog bit weight of a current bit for each of the bits of the digital input signal 114. The method 150 calibrates each bit (for i from 1 to NL−1), starting from the LSB, of the digital input signal 114. In other words, the method 150 iteratively calibrates each bit i to determine a digital weight WLi.

Figure 8:
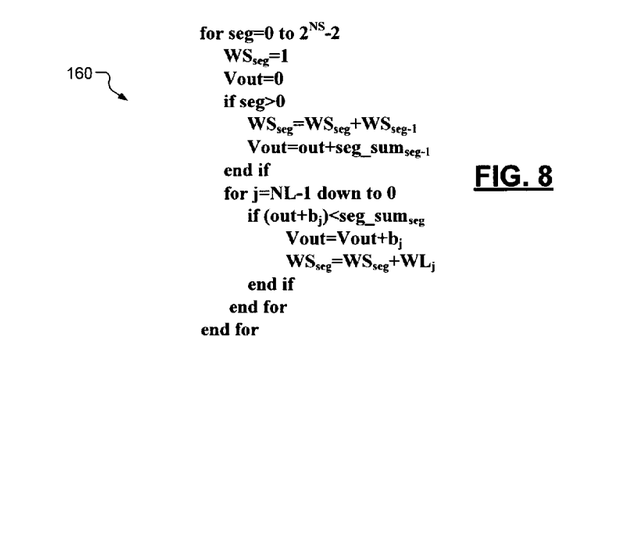
FIG. 8 illustrates a segment calibration method using recursive successive approximation according to the present disclosure.

Referring now to FIG. 8, the MSB segment calibration step is performed using a segment calibration method 160. The method 160 asserts and calibrates each segment seg from the LSB segments to the MSB segments (from 0 to 2NS−2). When a current segment seg is asserted, segments 0 through seg are each turned on. A total number of monotonic codes below segment seg equals a sum of a total number of monotonic codes below segment seg−1 (or zero if seg=0) and a total number of monotonic codes between segment seg and segment seg−1 (or a zero code output if seg=0).

Figure 9:
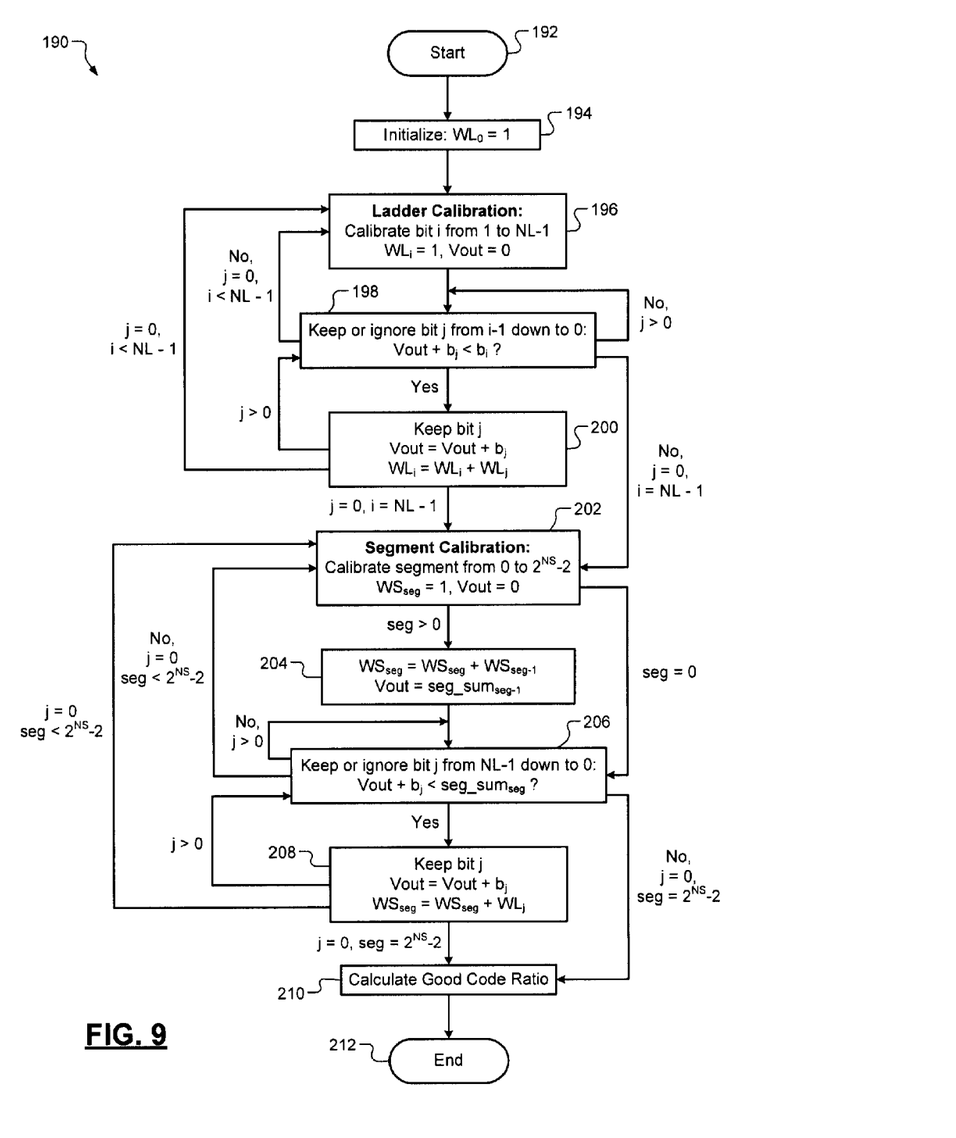
FIG. 9 is a flow diagram illustrating steps of the ladder calibration method and the segment calibration method according to the present disclosure.

Referring now to FIG. 9, the methods 150 and 160 are shown as a flow diagram 190 that begins in step 192. In step 194, WL0 is set as 1. In other words, the digital weight of bit b0 is set to 1. In step 196, ladder calibration begins in order to calibrate bit i from 1 to NL−1, and values of WLi and Vout are initialized to 1 and 0, respectively. The LSBs below bit i are then evaluated in step 198 to determine whether to keep or ignore each bit. Among the LSBs below bit i and starting from the MSB, j bits (from i−1 to 0) are iteratively evaluated. In step 198, control determines whether a sum of Vout and bj (i.e. an analog bit weight of a current bit j) is less than bi. If true, control continues to step 200 to keep (i.e. set to 1) the current bit j. If false, control ignores (i.e. sets to 0) the current bit j. If false and j is greater than 0, control repeats step 198. If false, j=0, and i is less than NL−1, control continues to step 196. If false, j=0, and i=NL−1, control continues to step 202 to begin segment calibration.

In step 200, control keeps bit j, sets Vout equal to a sum of Vout and bj, and sets WLi equal to a sum of WLi and WLj, and determines whether all bits (from i−1 to 0 and from i+1 to NL−1) have been evaluated. If true (e.g. j=0 and i=NL−1), control continues to step 202 to begin segment calibration. If j is greater than 0, control returns to step 198. If j=0 and i is less than NL−1, control returns to step 196.

In step 202, segment calibration begins in order to calibrate each segment bit from 0 to 2NS−2, and values of WSseg and Vout are initialized to 1 and 0, respectively. If seg is greater than 0, control continues to step 204. If seg=0, control continues to step 206. In step 204, for seg greater than 0, a sum of WSseg and WSseg−1 is stored as a new value for WSseg, and an output (seg_sumseg−1) when asserting segment seg−1 (i.e. when segments 0 through seg−1 are each turned on) is stored as a new value for Vout.

In steps 206 and 208, control determines whether to keep or ignore each bit of the ladder module 102 for j bits (for j from NL−1 to 0). In step 206, control determines whether a sum of Vout and an analog bit weight of a current bit j is less than seg_sumseg. If true, control continues to step 208 to keep (i.e. set to i) the current bit j. If false, control ignores (i.e. sets to 0) the current bit j. If false, j=0, and seg=2NS−2, control continues to step 210. If false and j is greater than 0, control repeats step 206. If false, j=0, and seg is less than 2NS−2, control returns to step 202.

In step 208, control keeps bit j, sets Vout equal to a sum of Vout and the analog bit weight of the current bit j and sets WSseg equal to a sum of WSseg and WLj, and determines whether all bits (for j from NL−1 to 0) and all segments (i.e. through segment 2NS−2) have been evaluated. If true (e.g. j=0 and seg=2NS−2), control continues to step 210. If false and j is greater than 0, control returns to step 206. If false, j=0, and seg is less than 2NS−2, control returns to step 202. In step 210, control calculates the good code ratio. For example only, control calculates the good code ratio according to $$\text{ratio} = \frac{\sum WL_i + WS_{2^{NS}-2} + 1}{2^M}.$$

Control ends calibration in step 212.

Figure 10:
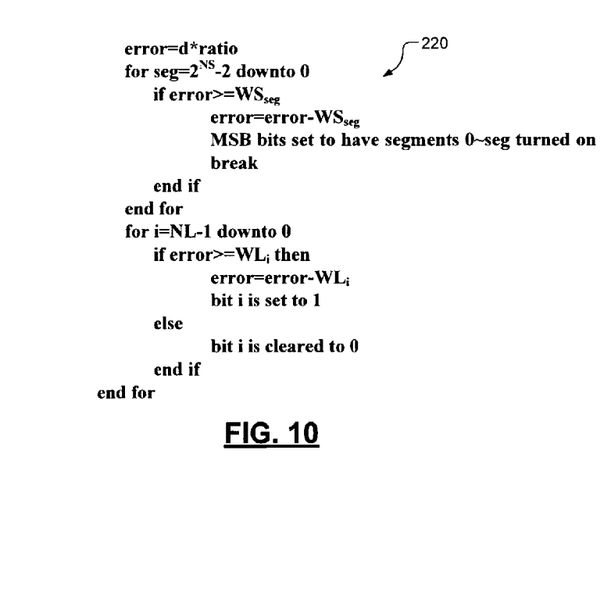
FIG. 10 illustrates a radix conversion method for performing a radix conversion step according to the present disclosure.

Referring now to FIG. 10, the radix conversion step is performed using a radix conversion method 220. The radix conversion method 220 determines which bits of the DAC 100 are kept (i.e. set to 1) and which bits are cleared or ignored (i.e. set to 0). The radix conversion method 220 according to the present disclosure calculates a total number of monotonic codes (code_total) and the good code ratio (code_ratio) based on the code_total and performs the radix conversion step based in part on the good code ratio. Incorporating the good code ratio into the radix conversion allows all available monotonic codes to be selected to form the DAC transfer function. Consequently, both differential non-linearity (DNL) and integral non-linearity (INL) performance are significantly improved.

Assuming an input DAC code (e.g. the digital input signal 114) is m (e.g., an integer) bits and a sub-binary radix DAC (e.g. the DAC 100) is N bits (where N=NL+NS and N>m), an input DAC code is indicated by d. The code_total is calculated according to code_total $\Sigma WL_i + WS_{2^{NS}-2}+1$. The code ratio corresponds to a ratio of the code_total to an m bit full code, or $$\frac{\text{code\_total}}{2^m}.$$

Figure 11:
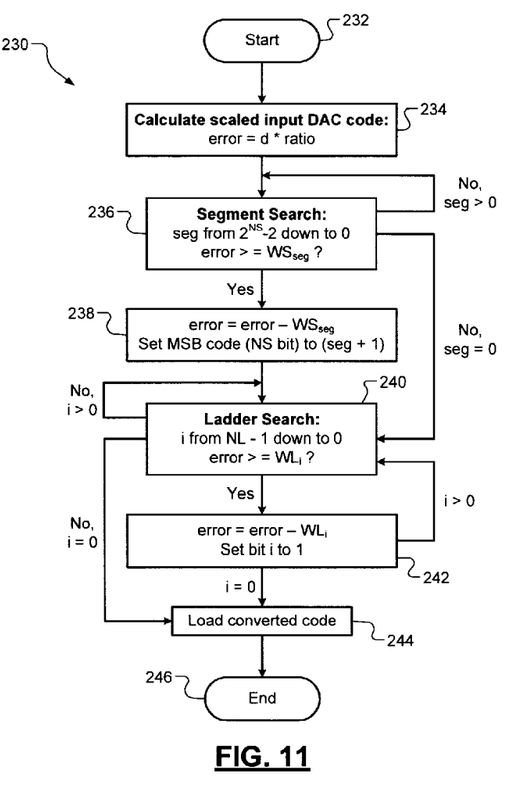
FIG. 11 is a flow diagram illustrating steps of the radix conversion method according to the present disclosure.

Referring now to FIG. 11, the method 220 is shown as a flow diagram 230 that begins in step 232. In step 234, control calculates a scaled input DAC code. For example, an "error"

value is initialized to d * ratio (where "ratio" corresponds to the ratio of code_total to the m bit full code, and d is the m bit pre-scaled input DAC code).

In step 236, control begins a segment search. For example, starting from the MSB segment (for seg from 2NS−2 to 0), control finds a first segment having a total number of monotonic codes less than the scaled input code (error). If no segment meets this criterion, then no segments are turned on. Control determines whether error is greater than or equal to WSseg. If true, control continues to step 238. If false and seg is greater than 0, control repeats step 236 for the next WSseg. If false and seg=0, control continues to step 240 to begin a ladder search. In step 238, control sets a new value of the error to error—WSseg (for the first segment less than the error), and turns on segments 0 through seg of the MSB bits (i.e. sets MSB code (NS bit) to (seg+1)).

Control performs the ladder search for each bit, for i from NL−1 down to 0, in steps 240 and 242. In step 240, control determines whether error is greater than or equal to WLi of a current bit i. If true, control continues to step 242. If false, control ignores bit i (i.e. sets bit i to 0). If false and i is greater than 0, control repeats step 240. If false and i=0, control continues to step 244. In step 242, control sets a new value of error to error—WLi and keeps bit i (i.e. sets bit i to 1), and determines whether all bits (for i from NL−1 to 0) have been evaluated (i.e. i=0). If true, control continues to step 244. If false (i.e. i is greater than 0), control returns to step 240. In step 244, code conversion is completed and the converted code (e.g. a 22-bit code for NS=4 and NL=18) is stored. For example, control may load the code into a DAC register. Control ends radix conversion in step 246.

Figures 12, 13:
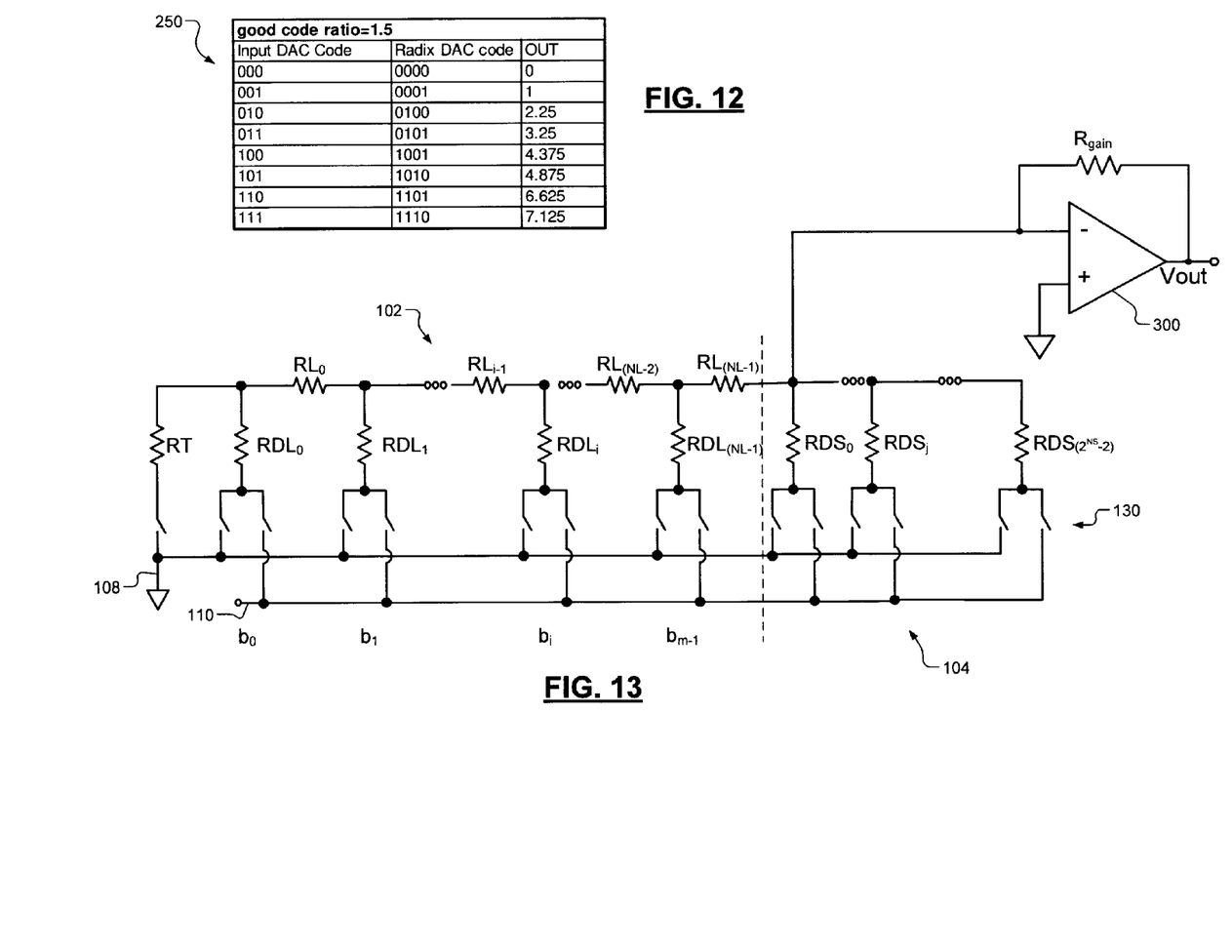
FIG. 12 is a code mapping table of a sub-binary radix DAC according to the present disclosure.
FIG. 13 is a schematic of a sub-binary radix DAC incorporating gain trim according to the present disclosure.

An example code mapping table 250 according to the present disclosure for input DAC codes from 000 to 111 and a code ratio of 1.5 is shown in FIG. 12. The example code mapping table 250 corresponds to the following design parameters: effective number of bits (i.e. bits of input DAC code)=3; radix DAC number of bits=4; and radix=1.5.

Referring now to FIG. 13, the incorporation of the code ratio into the radix conversion method 220 allows a desired gain trim to be achieved without an additional analog or digital trim network. In particular, the code ratio may be adjusted to achieve a high resolution gain trim. For example only, the DAC 100 may include an inverting output amplifier 300 and a resistor Rgain connected to the resistor RDS0 of the MSB segment module 104. When a value of Rgain is larger than a nominal DAC output resistance RDAC, a positive initial gain error is introduced to the DAC 100. Accordingly, the code ratio can be adjusted downward to achieve the desired gain trim. For example only, the code ratio can be calculated according to $$\text{code\_ratio} = \frac{\text{code\_total}}{2^M} * \frac{RDAC}{R_{gain}}.$$

Figure 14A:
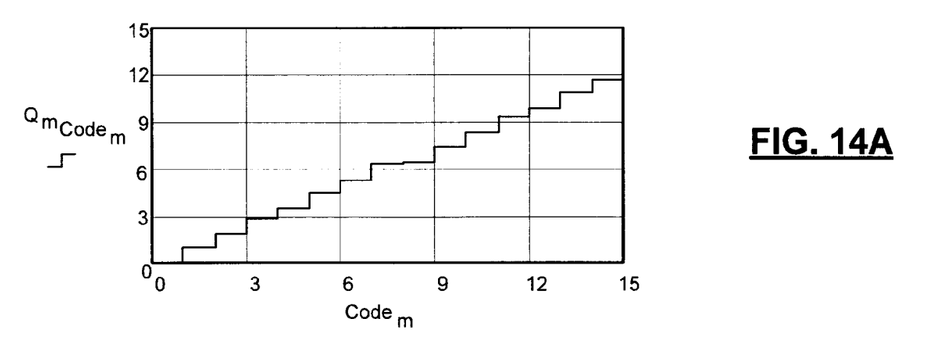
FIG. 14A illustrates DAC output after calibration according to the prior art.
Figure 14B:
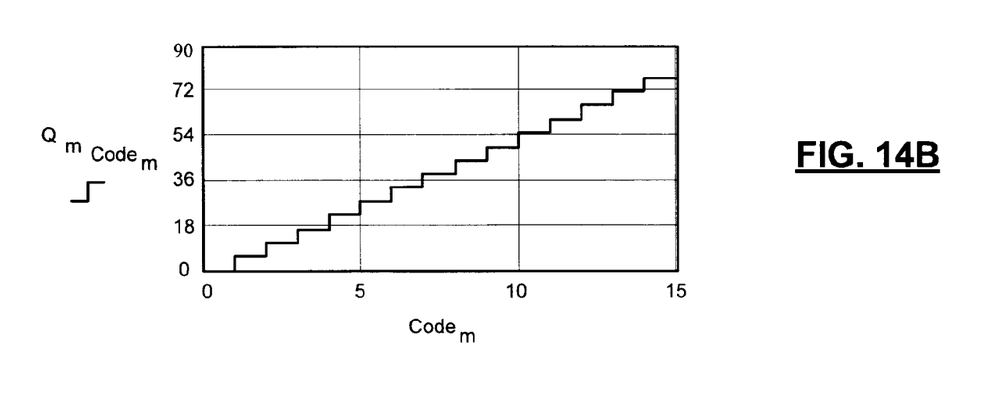
FIG. 14B illustrates DAC output after calibration according to the present disclosure.
Figure 15A:
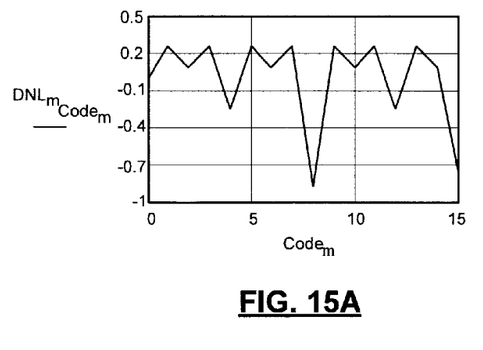
FIG. 15A illustrates DNL after calibration according to the prior art.
Figure 15B:
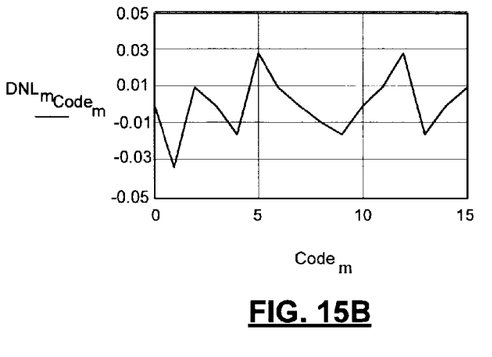
FIG. 15B illustrates DNL after calibration according to the present disclosure.
Figure 16A:
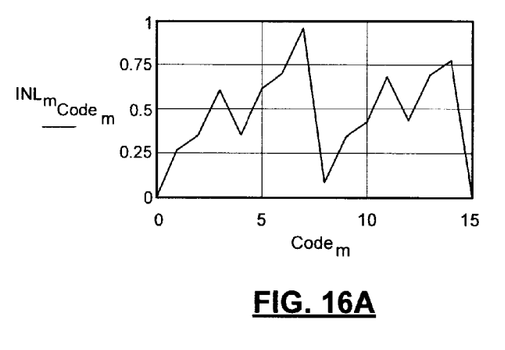
FIG. 16A illustrates INL after calibration according to the prior art.
Figure 16B:
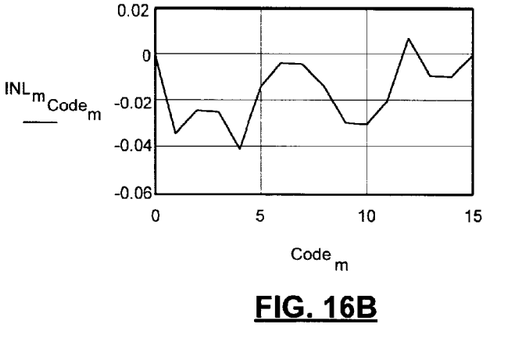
FIG. 16B illustrates INL after calibration according to the present disclosure.

Referring now to FIGS. 14A and 14B, DAC output after calibration is shown for a conventional DAC and the DAC 100 according to the present disclosure, respectively. Referring now to FIGS. 15A and 15B, DNL after calibration is shown for a conventional DAC and the DAC 100 according to the present disclosure, respectively. Referring now to FIGS. 16A and 16B, INL after calibration is shown for a conventional DAC and the DAC 100 according to the present disclosure, respectively. For each of FIGS. 14A, 14B, 15A, 15B, 16A, and 16B, the following design parameters are assumed: effective number of bits=4; radix DAC number of bits=7; and radix=1.857.

Further, although the sub-binary radix DAC 100 as shown in FIG. 5 is described in FIGS. 5-16 as including the LSB ladder module 102, the DAC 100 may include other suitable structure (e.g., instead of and/or in addition to the LSB ladder module 102) for implementing the principles of the present disclosure. For example, the DAC 100 may implement structure including, but not limited to, various current source and/or voltage source non-segmented and segmented arrangements.

Figure 17:
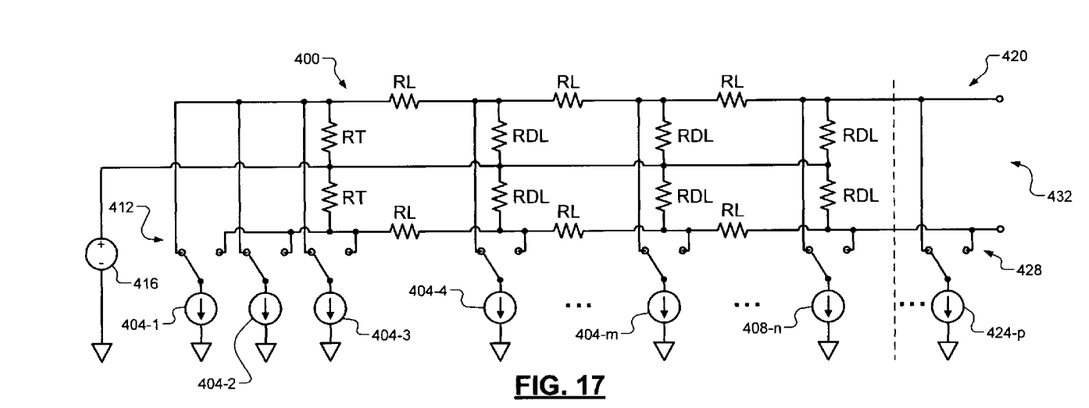
FIG. 17 is a schematic of a combination of an example current source ladder module and an MSB segment module of a sub-binary radix DAC according to the present disclosure.

Referring now to FIG. 17, another example ladder module 400 is shown to include resistors RL, resistors RDL, and termination resistors RT. Each of the resistors RL has a value R and each of the resistors RDL has a value βR. The termination resistors RT each have a value of $[(\gamma*\beta)/(\gamma+\beta)]R$. The values of β and γ satisfy the equation $\gamma 2=\beta+\gamma$. The ladder module 400 further includes current sources 404-1, 404-2, 404-3, 404-4, . . . , and 404-m, referred to collectively as current sources 404, one or more current sources 408-n, referred to collectively as current sources 408, respective switches 412, and a common mode voltage source 416. An example segment module 420 is shown to include one or more current sources 424-p, referred to collectively as current sources 424, and respective switches 428. Each of the current sources 404, 408, and 424 and the common mode voltage source 416 is connected to an analog reference signal such as ground. Although the ladder module 400 and the segment module 420 are shown including a differential voltage output 432, those skilled in the art can appreciate that the ladder module 400 and the segment module 420 may be arranged to provide a single-ended voltage output.

Accordingly, the ladder module 400 and the segment module 420 provide similar functions as described in FIGS. 5-16 using the current sources 404, 408, and 424. For example only, the current sources 404, 408, and 424 include MOS and/or bipolar current sources. For example, the current sources 404-3, 404-4, 404-m, 408-n, and 424-p may have a value of I, the current source 404-2 may have a value of I/2, and the current source 404-1 may have a value of I/4. In some implementations, the current sources 404, 408, and 424 may be scaled (i.e., weighted) according to a desired sub-radix calibration. For example, the current sources 404 may have values that correspond to a mixed radix to achieve a desired linearity calibration of the DAC, and the current sources 408-n correspond to any desired multiple of non-segmented current sources. Conversely, the current sources 424-p corresponds to any desired number of, for example only, sub-binary radix current sources.

Figure 18:
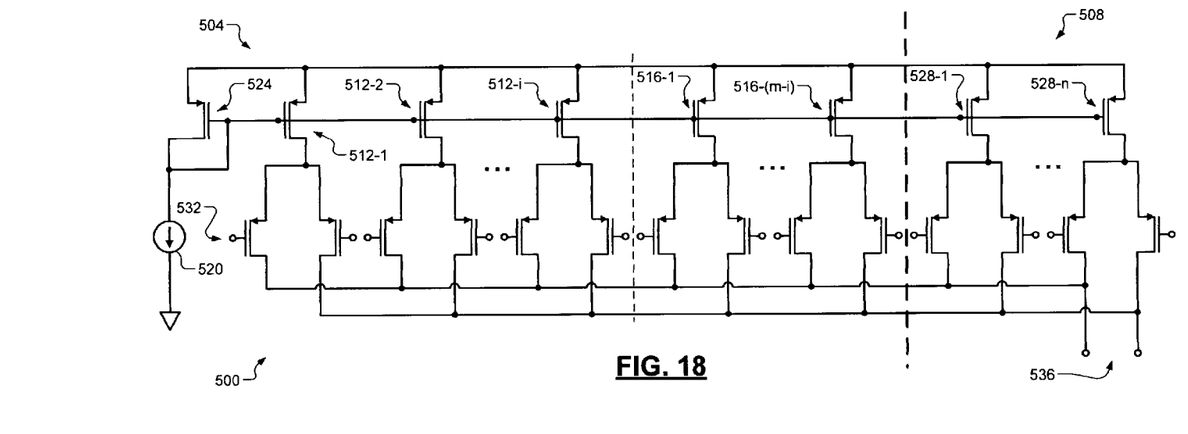
FIG. 18 is a schematic of a combination of another example current source ladder module and an MSB segment module of a sub-binary radix DAC according to the present disclosure.

Referring now to FIG. 18, an example current mode DAC 500 includes an LSB module 504 and an MSB segment module 508. The LSB module 504 includes LSB transistors 512-1, 512-2, . . . , and 512-i, referred to collectively as LSB transistors 512, each corresponding to a respective one of i LSBs having a radix of r1, and MSB transistors 516-1 . . . 516-(m-i), referred to collectively as MSB transistors 516, each corresponding to a respective one of m-i MSBs having a radix of r2. A current source 520 provides a current (e.g., 1LSB) to the transistors 512 and 516 via a transistor 524. The MSB segment module 508 includes segment transistors 528-1, . . . , and 528-n, referred to collectively as segment transistors 528, each corresponding to one of n segments having a radix of r2.

Respective sizes of the transistors 512, 516, and 528 may be scaled according to a desired sub-radix calibration. For example, the transistors 524 and 512-1 may have a unit size of 1x. The transistor 512-2 may have a size of r1*x. The transistor 512-$i$ may have a size of r1^($i$−1)*x. The transistor 516-1 may have a size of r2^(m−1)*x. The transistors 528-1 and 528-($m$-$i$) may each have a size of r2^m*x.

Each of the transistors 512, 516, and 528 communicates with a corresponding one of pairs of switches (i.e., transistors) 532. For example only, each of the pairs of switches 532 operates as described above (e.g., with respect to the switches 130 shown in FIG. 6) to set or clear selected bits of the LSB module 504 and the MSB segment module 508. For example, a bit may be set when one of the switches 532 in a given pair is closed, and the bit may be cleared when the other of the switches 532 in the given pair is closed. For example only, respective gates of the pair of switches 532 corresponding to the transistor 512-1 may receive a signal corresponding to a data bit 1 and a signal corresponding to an inverse of the data bit 1. Similarly, respective gates of the pair of switches 532 corresponding to the transistor 512-$i$ may receive a signal corresponding to a data bit i and a signal corresponding to an inverse of the data bit i. For example only, a switch control module such as the switch control module 106 shown in FIG. 5 generates the signals to control the switches 532 to set and clear respect bits of the DAC 500. The DAC 500 generates an output 536 according to the current source 520 and the operation of the transistors 512, 516, and 528 and the switches 532.

Those skilled in the art can appreciate that the current source/mode DACs described in FIGS. 17 and 18 are only two example alternative arrangements of a ladder (or LSB module) and/or a segment module. For example only, various current source/mode structures, voltage source/mode structures, and other suitable structures including a plurality of circuit elements corresponding to DAC bits and segments may be provided to implement a segment module according to the principles of the present disclosure. The plurality of circuit elements may include, but are not limited to, NL resistors, transistors, and/or current sources corresponding to ladder bits of the DAC, and NS resistors, transistors, and/or current sources corresponding to segment bits of the DAC, connected in parallel as shown in FIGS. 6, 17, and 18.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. An N bit sub-binary radix digital-to analog converter (DAC), the DAC comprising:
    a radix conversion module that converts an m bit digital input signal to an N bit sub-radix DAC code;
    a ladder module having NL bits and a plurality of first circuit elements corresponding to first respective bits of the N bit sub-radix DAC code; and
    a segment module having NS bits and at least one second circuit element corresponding to second respective bits of the N bit sub-radix DAC code,
    wherein N>m, and N is a sum of NL and NS.

2. The DAC of claim 1, wherein the plurality of first circuit elements and the at least one second circuit element are connected in parallel.

3. The DAC of claim 1, wherein the plurality of first circuit elements and the at least one second circuit element include at least one of a plurality of resistors, a plurality of current sources, a plurality of voltage sources, and a plurality of transistors.

4. The DAC of claim 1, wherein the radix conversion module determines a code ratio that is a ratio of a total number of available monotonic codes to $2^m$, and wherein the converting includes performing radix conversion on the m bit digital input signal based on the code ratio.

5. The DAC of claim 4, wherein the radix conversion includes multiplying the m bit digital input signal by the code ratio.

6. The DAC of claim 4, wherein the radix conversion module adjusts the code ratio to achieve a desired gain trim.

7. The DAC of claim 4, further comprising:
    an amplifier connected to the DAC; and
    a gain resistor connected to the amplifier and the DAC,
        wherein the radix conversion module adjusts the code ratio based on a resistance $R_{gain}$ of the gain resistor.

8. The DAC of claim 7, wherein the radix conversion module adjusts the code ratio further based on a DAC output resistance RDAC that is less than $R_{gain}$.

9. The DAC of claim 8, wherein the radix conversion module adjusts the code ratio by multiplying the code ratio by $RDAC/R_{gain}$.

10. The DAC of claim 1, wherein a first number of the NL bits are associated with a first radix and a second number of the NL bits are associated with a second radix that is different than the first radix.

11. A method for operating an N bit sub-binary radix digital-to analog converter (DAC), the method comprising:
converting an m bit digital input signal to an N bit sub-radix DAC code;
receiving, at a bit ladder module having NL bits and a plurality of first circuit elements, first input signals corresponding to first respective bits of the N bit sub-radix DAC code; and
receiving, at a segment module having NS bits and at least one second circuit element, second input signals corresponding to second respective bits of the N bit sub-radix DAC code,
wherein N>m, and N is a sum of NL and NS.

12. The method of claim 11, further comprising connecting the plurality of first circuit elements and the at least one second circuit element in parallel.

13. The method of claim 11, wherein the plurality of first circuit elements and the at least one second circuit element include at least one of a plurality of resistors, a plurality of current sources, a plurality of voltage sources, and a plurality of transistors.

14. The method of claim 11, further comprising determining a code ratio that is a ratio of a total number of available monotonic codes to $2^m$, wherein the converting includes performing radix conversion on the m bit digital input signal based on the code ratio.

15. The method of claim 14, wherein the radix conversion includes multiplying the m bit digital input signal by the code ratio.

16. The method of claim 14, further comprising adjusting the code ratio to achieve a desired gain trim.

17. The method of claim 14, further comprising:
connecting an amplifier to the DAC;
connecting a gain resistor to the amplifier and the DAC; and
adjusting the code ratio based on a resistance $R_{gain}$ of the gain resistor.

18. The method of claim 17, further comprising adjusting the code ratio further based on a DAC output resistance RDAC that is less than $R_{gain}$.

19. The method of claim 18, further comprising adjusting the code ratio by multiplying the code ratio by $RDAC/R_{gain}$.

20. The method of claim 11, wherein a first number of the NL bits are associated with a first radix and a second number of the NL bits are associated with a second radix that is different than the first radix.

* * * * *

UNITED STATES PATENT AND TRADEMARK OFFICE
CERTIFICATE OF CORRECTION

Page 1 of 2

PATENT NO. : 8,717,214 B1
APPLICATION NO. : 13/669958
DATED : May 6, 2014
INVENTOR(S) : Yuanfang Li et al.

It is certified that error appears in the above-identified patent and that said Letters Patent is hereby corrected as shown below:

In the Specification:

| | |
|---|---|
| Column 2, Line 7 | Delete "$R_i$," and insert --$RL_i$,-- |
| Column 2, Line 20 | Delete "$Ra_i$," and insert --$RDL_i$,-- |
| Column 4, Line 47 | Delete "RL0 . . . RLNL-1," and insert --$RL_0$ . . . $RL_{(NL-1)}$,-- |
| Column 4, Line 48 | Delete "RLi," and insert --$RL_i$,-- |
| Column 4, Line 48 | Delete "RDL0 . . . RDLNL-1," and insert --$RDL_0$ . . . $RDL_{(NL-1)}$,-- |
| Column 4, Line 49 | Delete "RDLi," and insert --$RDL_i$,-- |
| Column 4, Line 50 | Delete "RLi" and insert --$RL_i$-- |
| Column 4, Line 51 | Delete "RDLi" and insert --$RDL_i$-- |
| Column 4, Line 54 | Delete "RDS0 . . . RDS(2NS-2)," and insert --$RDS_0$ . . . $RDS_{(2^{NS}-2)}$,-- |
| Column 4, Line 55 | Delete "RDSj." and insert --$RDS_j$,-- |
| Column 4, Line 55 | Delete "RDSj" and insert --$RDS_j$-- |
| Column 4, Line 57 | Delete "RDLi," and insert --$RDL_i$,-- |
| Column 4, Line 57 | Delete "RDSj" and insert --$RDS_j$-- |
| Column 5, Line 35 | Delete "WLi." and insert --$WL_i$.-- |
| Column 5, Line 39 | Delete "2NS-2)." and insert --$2^{NS}-2$).-- |
| Column 5, Line 48 | Delete "WL0" and insert --$WL_0$-- |
| Column 5, Line 50 | Delete "WLi" and insert --$WL_i$-- |
| Column 5, Line 55 | Delete "bj" and insert --$b_j$-- |
| Column 5, Line 56 | Delete "bi" and insert --$b_i$-- |
| Column 5, Line 64 | Delete "bj," and insert --$b_j$,-- |
| Column 5, Line 64 | Delete "WLi" and insert --$WL_i$-- |
| Column 5, Line 64 | Delete "WLi" and insert --$WL_i$-- |
| Column 5, Line 64 | Delete "WLj," and insert --$WL_j$,-- |
| Column 6, Line 4 | Delete "2NS-2," and insert --$2^{NS}-2$,-- |
| Column 6, Line 4 | Delete "WSseg" and insert --$WS_{seg}$-- |
| Column 6, Line 8 | Delete "WSseg" and insert --$WS_{seg}$-- |
| Column 6, Line 8 | Delete "WSseg-1" and insert --$WS_{seg-1}$-- |
| Column 6, Line 8 | Delete "WSseg," and insert --$WS_{seg}$,-- |

Signed and Sealed this
Twelfth Day of August, 2014

Michelle K. Lee
*Deputy Director of the United States Patent and Trademark Office*

CERTIFICATE OF CORRECTION (continued)
U.S. Pat. No. 8,717,214 B1

| | |
|---|---|
| Column 6, Line 9 | Delete "(seg_sumseg-1)" and insert --(seg_sum$_{seg-1}$)-- |
| Column 6, Line 16 | Delete "seg_sumseg." and insert --seg_sum$_{seg}$.-- |
| Column 6, Line 18 | Delete "seg=2NS-2," and insert --seg=$2^{NS}$-2,-- |
| Column 6, Line 20 | Delete "2NS-2," and insert --$2^{NS}$-2,-- |
| Column 6, Line 24 | Delete "WSseg" and insert --WS$_{seg}$-- |
| Column 6, Line 24 | Delete "WSseg" and insert --WS$_{seg}$-- |
| Column 6, Line 24 | Delete "WLj," and insert --WL$_j$,-- |
| Column 6, Line 26 | Delete "2NS-2)" and insert --$2^{NS}$-2)-- |
| Column 6, Line 27 | Delete "seg=2NS-2)," and insert --seg=$2^{NS}$-2),-- |
| Column 6, Line 29 | Delete "2NS-2," and insert --$2^{NS}$-2,-- |
| Column 6, Line 57 | After "code_total", insert --=-- |
| Column 7, Line 5 | Delete "2NS-2" and insert --$2^{NS}$-2-- |
| Column 7, Line 10 | Delete "WSseg." and insert --WS$_{seg}$.-- |
| Column 7, Line 11 | Delete "WSseg." and insert --WS$_{seg}$.-- |
| Column 7, Line 14 | Delete "WSseg" and insert --WS$_{seg}$-- |
| Column 7, Line 20 | Delete "WLi" and insert --WL$_i$-- |
| Column 7, Line 25 | Delete "WLi" and insert --WL$_i$-- |
| Column 7, Line 46 | Delete "Rgain" and insert --R$_{gain}$-- |
| Column 7, Line 46 | Delete "RDS0" and insert --RDS$_0$-- |
| Column 7, Line 47 | Delete "Rgain" and insert --R$_{gain}$-- |
| Column 9, Line 24 | Delete "respect" and insert --respective-- |